(12) United States Patent
Gambino et al.

(10) Patent No.: US 9,455,187 B1
(45) Date of Patent: Sep. 27, 2016

(54) BACKSIDE DEVICE CONTACT

(71) Applicant: International Business Machines Corporation, Armonk, NY (US)

(72) Inventors: Jeffrey P. Gambino, Portland, OR (US); Mark D. Jaffe, Shelburne, VT (US); Steven M. Shank, Jericho, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/742,958

(22) Filed: Jun. 18, 2015

(51) Int. Cl.
*H01L 21/30* (2006.01)
*H01L 21/768* (2006.01)
*H01L 21/762* (2006.01)
*H01L 21/683* (2006.01)

(52) U.S. Cl.
CPC ..... *H01L 21/76895* (2013.01); *H01L 21/6835* (2013.01); *H01L 21/76251* (2013.01); *H01L 2221/68372* (2013.01)

(58) Field of Classification Search
CPC ............ H01L 21/76895; H01L 21/6835; H01L 21/76251; H01L 2221/68372
USPC ........................................................ 438/459
See application file for complete search history.

(56) References Cited

U.S. PATENT DOCUMENTS

| | | | |
|---|---|---|---|
| 5,569,621 A | 10/1996 | Yallup et al. | |
| 6,261,870 B1 | 7/2001 | Haehn | |
| 6,483,147 B1 | 11/2002 | Lin | |
| 7,402,866 B2 | 7/2008 | Liang et al. | |
| 7,563,714 B2 | 7/2009 | Erturk | |
| 7,816,231 B2 * | 10/2010 | Dyer | G03F 9/7084 438/311 |
| 8,021,943 B2 | 9/2011 | Botula et al. | |
| 8,198,734 B2 | 6/2012 | Anderson et al. | |
| 8,859,400 B2 | 10/2014 | Therrien | |
| 8,859,425 B2 | 10/2014 | Kirby | |
| 2011/0210309 A1 * | 9/2011 | Ben-Ishai | B82Y 10/00 257/9 |
| 2011/0260248 A1 * | 10/2011 | Smeys | H01L 21/76898 257/347 |
| 2014/0167209 A1 * | 6/2014 | Meiser | H01L 21/76224 257/506 |
| 2014/0302661 A1 * | 10/2014 | Cheng | H01L 21/84 438/424 |

OTHER PUBLICATIONS

Ali, Neve, Gharsallah, and Raskin, "RF Performance of SOI CMOS Technology on Commercial 200-mm Enhanced Signal Integrity High Resistivity SOI Substrate," IEEE Transactions on Electron Devices, vol. 61, No. 3, Mar. 2014, pp. 722-728.

* cited by examiner

*Primary Examiner* — Tod T Van Roy
*Assistant Examiner* — Vu A Vu
(74) *Attorney, Agent, or Firm* — Sherman IP LLP; Kenneth L. Sherman; Steven Laut

(57) ABSTRACT

Methods for fabricating a backside device contact using a silicon-on-insulator substrate that includes a device layer, a buried insulator layer, and a handle wafer. A trench is formed that extends through the device layer or a trench isolation region in the device layer and that further extends partially through the buried insulator layer. A sacrificial material is deposited in the trench and, thereafter, at least one dielectric layer is formed on the device layer. An opening is formed in the at least one dielectric layer that communicates with the trench. After the opening is formed, the sacrificial material is removed from the trench with access through the opening. After the sacrificial material is removed from the trench, the trench is filled with a contact plug and the opening is filled with a contact coupled with the contact plug.

18 Claims, 9 Drawing Sheets

BACKSIDE DEVICE CONTACT

BACKGROUND

The invention relates generally to semiconductor devices and integrated circuit fabrication and, in particular, to methods for fabricating a backside device contact.

Devices fabricated using semiconductor-on-insulator (SOI) technologies may exhibit certain performance improvements in comparison with comparable devices built directly in a bulk silicon substrate. Generally, an SOI wafer includes a thin device layer of semiconductor material, a handle substrate, and a thin buried insulator layer, such as a buried oxide or BOX layer, physically separating and electrically isolating the device layer from the handle substrate. Integrated circuits are fabricated using the semiconductor material of the device layer.

Wafer thinning has been driven by the need to make packages thinner to accommodate stacking and high density packaging of chips. An SOI wafer may be thinned by removing the handle wafer from its construction. Once thinned, the backside surface of the SOI wafer may be subjected to additional operations. To lend mechanical support during thinning and the additional operations performed subsequent to thinning, the frontside surface bearing the integrated circuits may be adhesively bonded to a temporary substrate. After the additional operations are performed, a final substrate may be attached to the backside surface and the temporary substrate may be removed.

Improved methods are needed for fabricating a backside device contact.

SUMMARY

In an embodiment of the invention, a method is provided for fabricating a backside device contact using a silicon-on-insulator substrate that includes a device layer, a buried insulator layer, and a handle wafer. A trench is formed that extends through the device layer or a trench isolation region in the device layer and that further extends partially through the buried insulator layer. A sacrificial material is deposited in the trench and, thereafter, at least one dielectric layer is formed on the device layer. An opening is formed in the at least one dielectric layer that communicates with the trench. After the opening is formed, the sacrificial material is removed from the trench with access through the opening. After the sacrificial material is removed from the trench, the trench is filled with a contact plug and the opening is filled with a contact coupled with the contact plug. The backside device contact includes the contact plug.

In another embodiment of the invention, a method is provided for processing a silicon-on-insulator substrate that includes a device layer, a buried insulator layer, and a handle wafer. A trench is formed that extends through the device layer or a trench isolation region in the device layer and that further extends partially through the buried insulator layer. A sacrificial material is deposited in the trench and, thereafter, the handle wafer is removed. After the handle wafer is removed, the buried insulator layer is partially removed to expose the trench containing the sacrificial material. After the trench is exposed, the sacrificial material is removed from the trench. After the sacrificial material is removed from the trench, a contact plug is formed in the trench. The backside device contact includes the contact plug.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
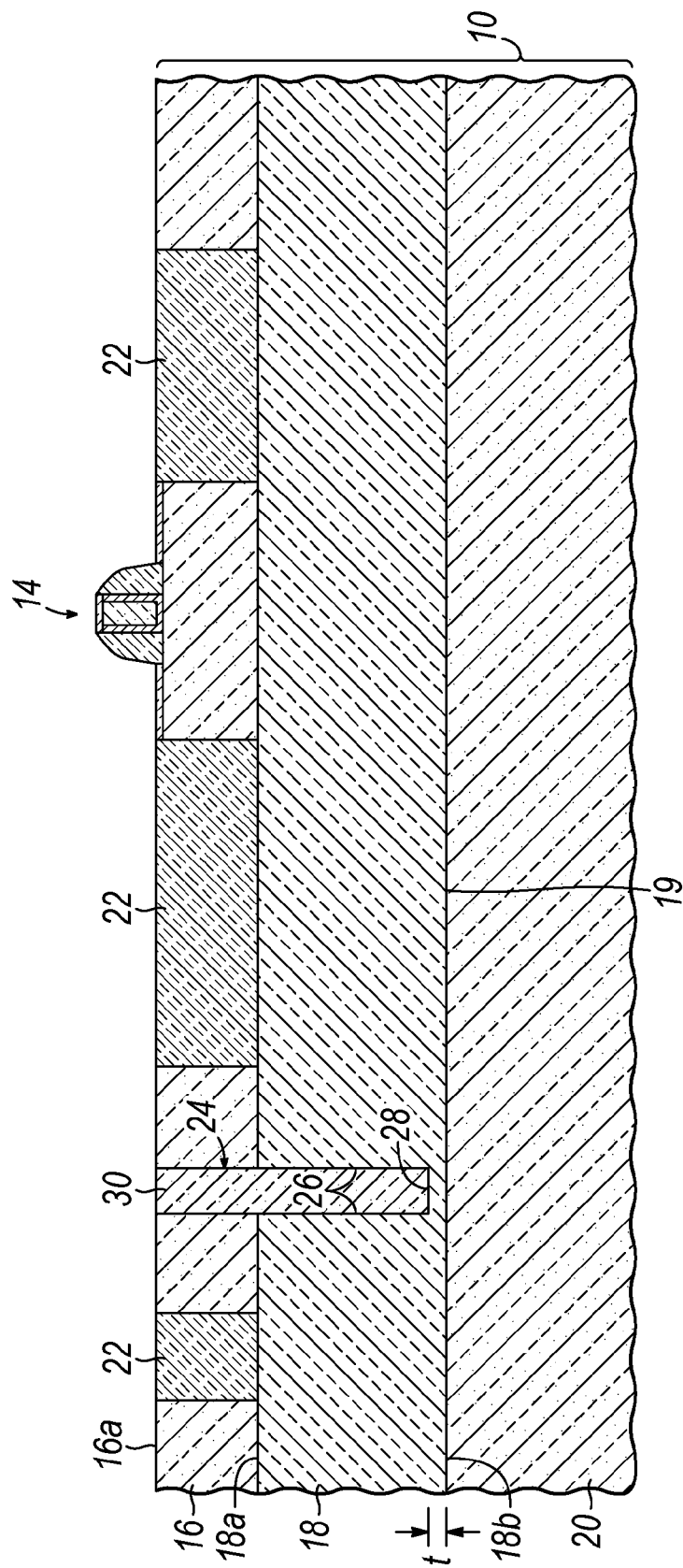
FIGS. 1-6 are cross-sectional views of a portion of a substrate at successive fabrication stages of a processing method for fabricating a backside device contact in accordance with an embodiment of the invention.

With reference to FIG. 1 and in accordance with an embodiment of the invention, a semiconductor-on-insulator (SOI) substrate 10 may include a device layer 16, a buried insulator layer 18, and a handle wafer 20. The device layer 16 is separated from the handle wafer 20 by the intervening buried insulator layer 18 and is considerably thinner than the handle wafer 20. The device layer 16 is in direct contact with a front surface 18a of the buried insulator layer 18, and the buried insulator layer 18 includes a backside or back surface 18b in direct contact with the handle wafer 20. The buried insulator layer 18 may be comprised of an electrical insulator and, in particular, may be a buried oxide layer comprised of silicon dioxide (e.g., $SiO_2$).

Shallow trench isolation regions 22 may be formed in the device layer 16 of the SOI substrate 10 to define a device region in the device layer 16. The shallow trench isolation regions 22 may be formed by depositing a hardmask, patterning the hardmask and device layer 16 with lithography and etching processes to define trenches, depositing an electrical insulator to fill the trenches, planarizing the electrical insulator relative to the hardmask using a chemical mechanical polishing (CMP) process, and removing the hardmask. In one embodiment, the shallow trench isolation regions 22 may be comprised of silicon dioxide ($SiO_2$) deposited by low-pressure chemical vapor phase deposition (LPCVD), and may penetrate completely through the device layer 16 to the front surface 18a of the buried insulator layer 18.

A trench 24 is formed that extends from a top surface 16a of the device layer 16 through the device layer 16, beyond a front surface 18a of the buried insulator layer 18 forming an interface with the device layer 16, and partially through the buried insulator layer 18. The sidewalls 26 of the trench 24 do not penetrate through the interface 19 between the buried insulator layer 18 and the handle wafer 20. The trench 24 has a bottom surface 28 that is separated from the interface 19 by a partial thickness, t, or portion of the buried insulator layer 18. To form the trench 24, a mask layer may be applied on a top surface 16a of the device layer 16 and patterned with photolithography. Specifically, an opening is defined in the mask layer at the intended location of the trench 24 to be subsequently formed. To that end, the mask layer may comprise a light-sensitive material, such as a photoresist, that is applied by a spin coating process, prebaked, exposed to light projected through a photomask, baked after exposure, and developed with a chemical developer to define an etch mask. An etching process is used, with the mask layer present on the top surface 16a of the device layer 16, to form the trench 24 at the location of the opening. The etching process may be conducted in a single etching step or multiple etching steps, may rely on one or more etch chemistries, and may be performed under conditions controlled to provide the limited penetration depth into the SOI substrate 10. The mask layer may be removed after the trench 24 is formed by the etching process. If comprised of a photoresist, the mask layer may be removed by ashing or solvent stripping, followed by a conventional cleaning process.

A sacrificial plug 30 is formed in the trench 24 and conforms in geometrical shape to the geometrical shape of the trench 24. In that regard, the sidewalls and bottom surface of the sacrificial plug 30 are respectively coextensive with the sidewalls 26 and bottom surface 28 of the trench 24. The sacrificial plug 30 extends from one end adjacent to the top surface 16a of the device layer 16 through the device layer 16 and partially through the buried insulator layer 18 to an opposite end that is proximate to the interface 19. As a consequence of the limited depth of the trench 24, the sacrificial plug 30 terminates within the buried insulator layer 18.

In a representative embodiment, the sacrificial plug 30 may be comprised of germanium (Ge) that is deposited by chemical vapor deposition (CVD). The sacrificial plug 30 is sacrificial in that the plug 30 is not present in the completed device structure and can be removed selective to surrounding materials in a subsequent processing stage of the fabrication method. As used herein, the term "selective" in reference to a material removal process (e.g., etching) denotes that, with an appropriate etchant choice, the material removal rate for the targeted material is higher than the removal rate for at least another material exposed to the material removal process.

Front-end-of-line (FEOL) processing is used to fabricate device structures 14 of one or more integrated circuits using the device layer 16. In a representative embodiment, the device structures 14 may include field-effect transistors fabricated by complementary metal-oxide-semiconductor (CMOS) processes. The field-effect transistor may include a gate stack comprised of a gate electrode and a gate dielectric layer positioned between the gate electrode and the device layer 16, as well as source/drain regions defined in the device layer 16. The conductor constituting the gate electrode may comprise, for example, metal, silicide, polycrystalline silicon (polysilicon), or any other appropriate material(s) deposited by chemical vapor deposition, etc. The gate dielectric may be comprised of a layer of a dielectric or insulating material such as silicon dioxide, silicon oxynitride, hafnium oxide, or any other appropriate material(s) deposited by, for example, chemical vapor deposition or grown by thermal oxidation. The source/drain regions may be formed by selectively doping the semiconductor material of the device layer 16 with ion implantation, dopant diffusion, etc.

Figure 2:
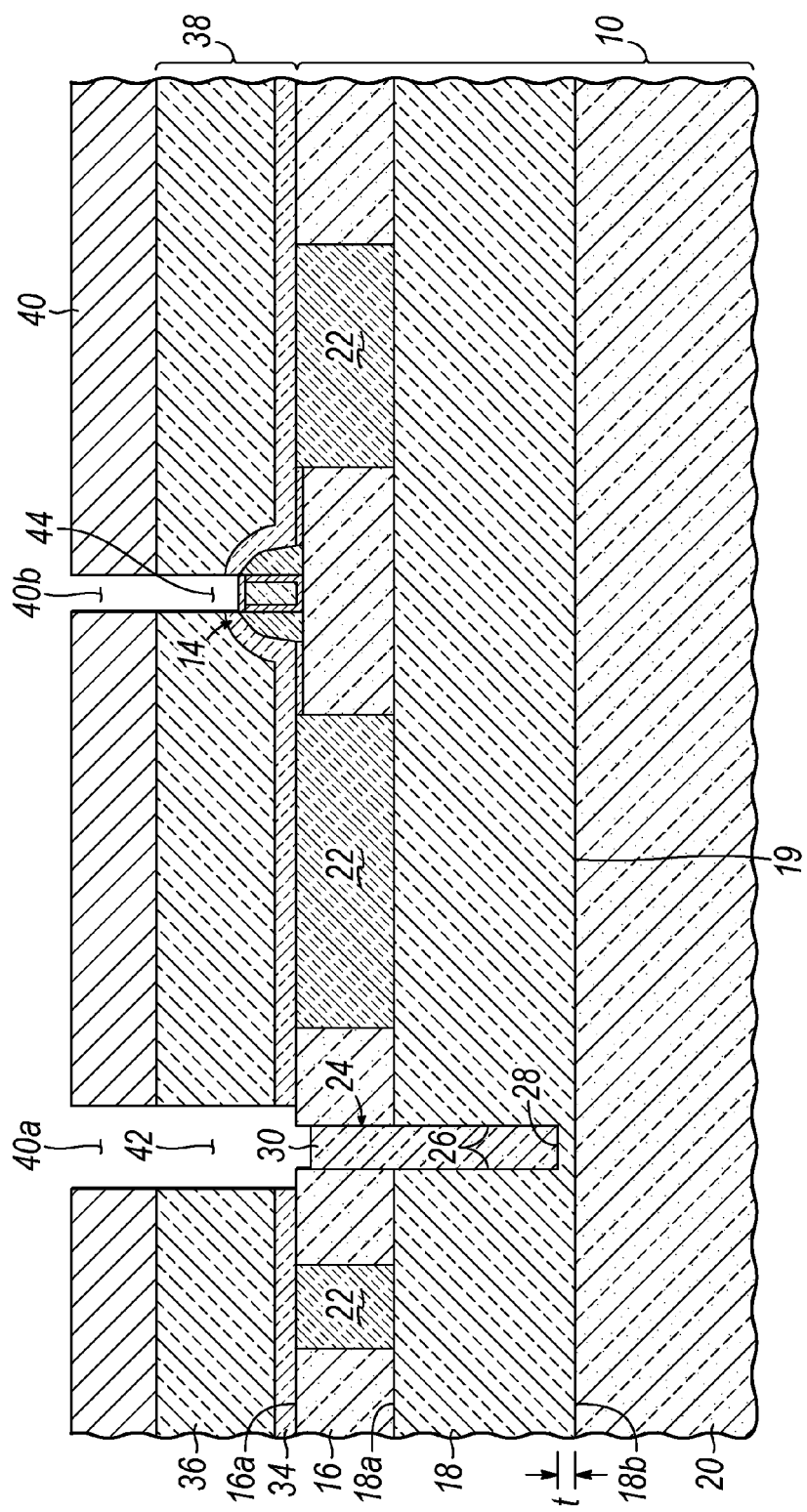

With reference to FIG. 2 in which like reference numerals refer to like features in FIG. 1 and at a subsequent fabrication stage of the processing method, middle-of-line (MOL) and back-end-of-line (BEOL) processing follows FEOL processing to form an interconnect structure 32 (FIG. 4) on the device layer 16 of the SOI substrate 10. In connection with MOL processing, a wiring level 38 of the interconnect structure 32 includes a plurality of dielectric layers 34, 36 that are serially deposited on the device layer 16. Dielectric layer 34 may be comprised of an electrical insulator, such as silicon nitride ($Si_3N_4$), that is conformally deposited by chemical vapor deposition. Dielectric layer 36 may be comprised of an electrical insulator, such as silicon dioxide, deposited by chemical vapor deposition and subsequently planarized using a chemical mechanical polishing process that eliminates topography.

A mask layer 40 may be applied on the top surface of the dielectric layer 36 and patterned with photolithography to define openings 40a, 40b. To that end, the mask layer 40 may comprise a light-sensitive material, such as a photoresist, that is applied by a spin coating process, pre-baked, exposed to light projected through a photomask, baked after exposure, and developed with a chemical developer to define an etch mask that features the openings 40a, 40b. With the mask layer 40 present, vias 42, 44 are formed at the respective locations of the openings 40a, 40b. The vias 42, 44, which extend through the dielectric layers 34, 36, may be formed using one or more etching processes each having a suitable etch chemistry. Via 42 is aligned with the sacrificial plug 30 and provides access from the top surface 16a of the device layer 16 to the sacrificial plug 30 for a subsequent etching process used to remove the sacrificial plug 30. Via 44 is aligned with a portion of the device structure 14 (e.g., the gate electrode of a field effect transistor), and is subsequently used to contact the portion of the device structure 14. Silicide present on top of the device structure 14 operates as an etch stop and the opening 40a is wider than opening 40b to promote the formation of the deeper via 42 in conjunction with the formation of the shallower via 44.

Figure 3:
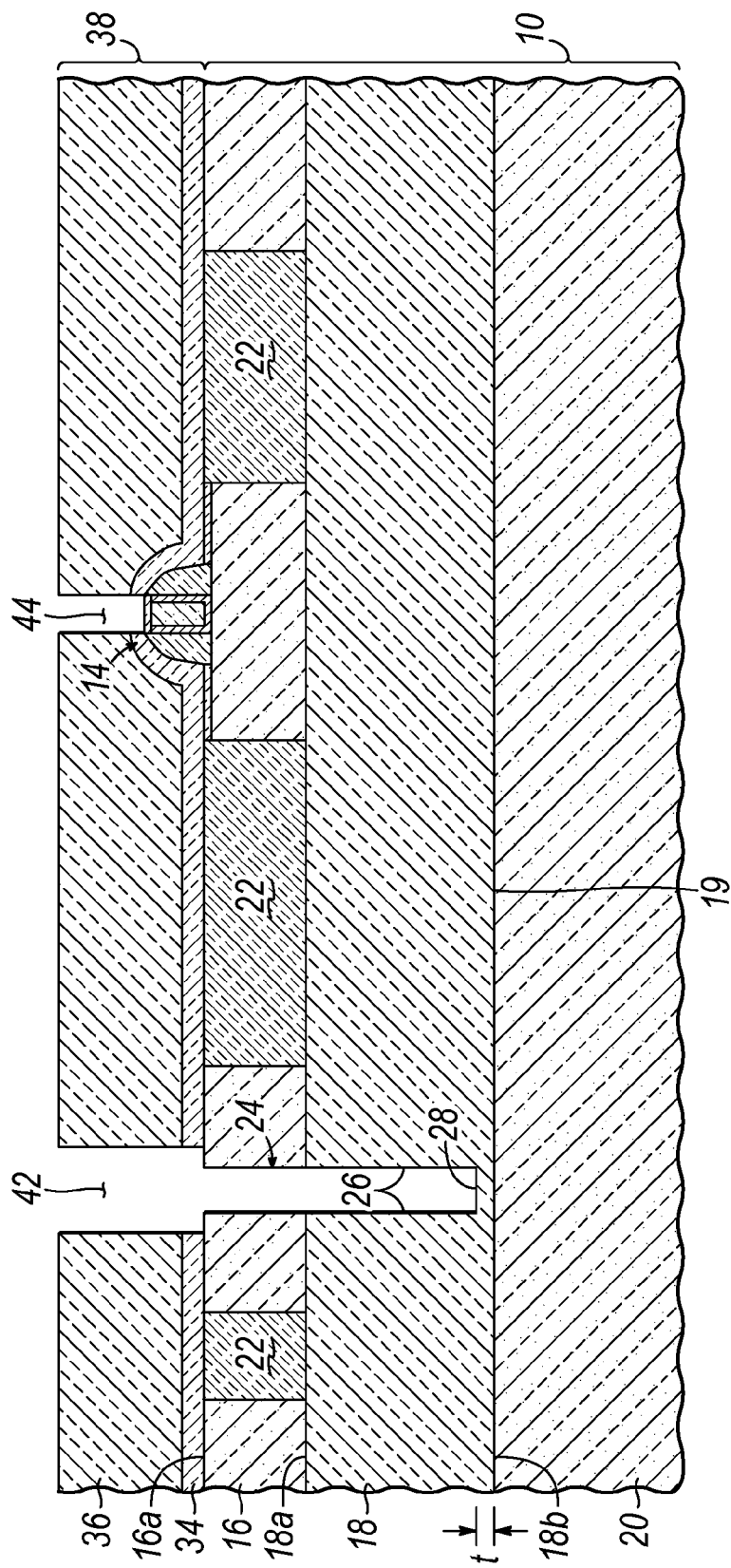

With reference to FIG. 3 in which like reference numerals refer to like features in FIG. 2 and at a subsequent fabrication stage of the processing method, the mask layer 40 is subsequently removed after the vias 42, 44 are formed in the dielectric layers 34, 36. If comprised of a photoresist, the mask layer 40 may be removed by ashing or solvent stripping, followed by a conventional cleaning process.

The sacrificial plug 30, which is revealed and accessible through the via 42, is removed from the trench 24. To that end, an etching process may be used to remove sacrificial plug 30 selective to the materials comprising the buried insulator layer 18 and the handle wafer 20. The selective etching process may be a dry or a wet chemical etching process. If the sacrificial plug 30 is comprised of germanium, a dry etching process utilizing a halogen-based plasma may be used to selectively remove the sacrificial plug 30. In one embodiment, the etching process may be a liner preclean that is used prior to depositing a liner in contact vias of the wiring level 38 in connection with MOL processing.

Figure 4:
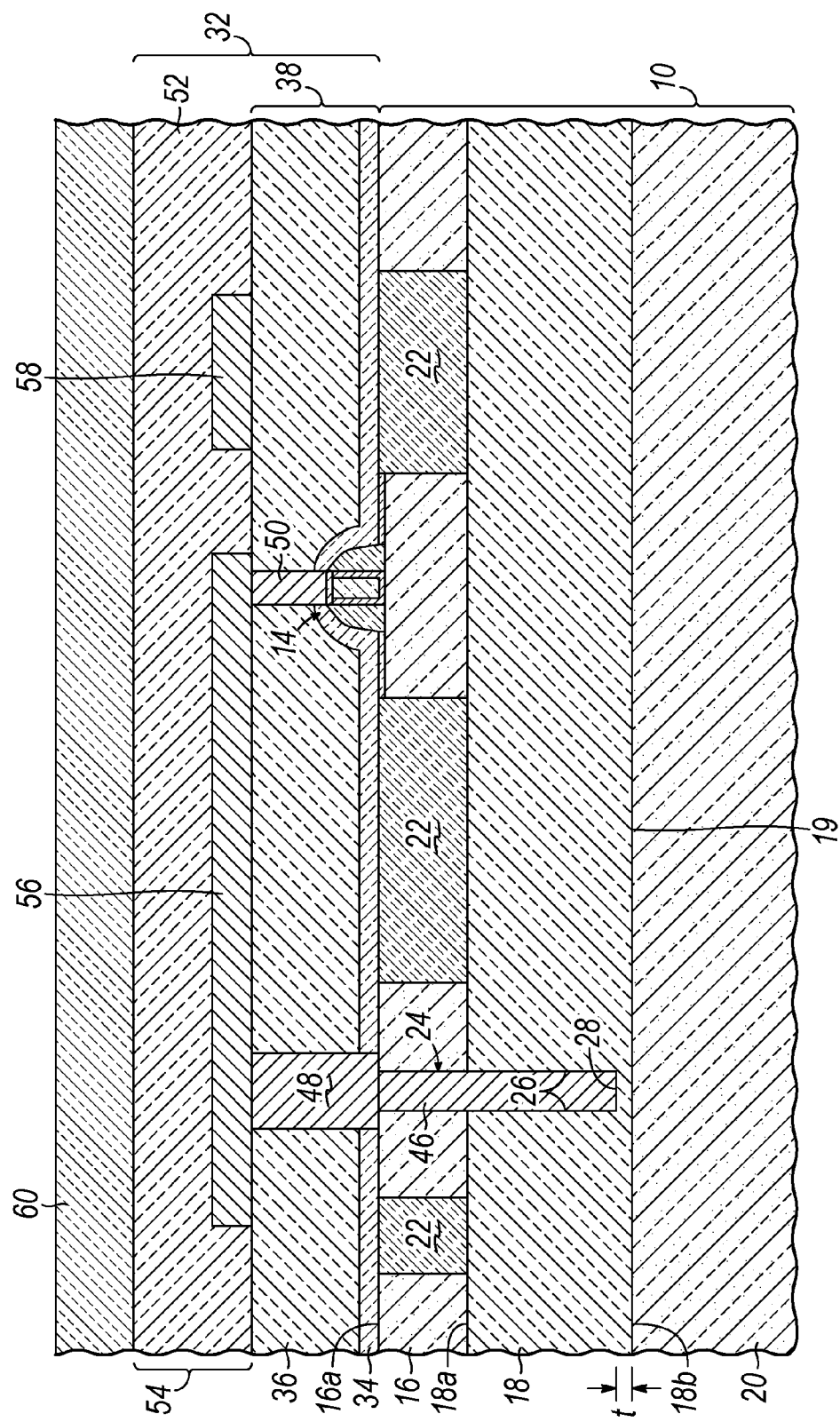

With reference to FIG. 4 in which like reference numerals refer to like features in FIG. 3 and at a subsequent fabrication stage of the processing method, a contact plug 46 is formed by depositing a conductor to fill the trench 24 and then planarizing the deposited conductor. The conductor also fills the via 42 to form a contact 48 and the via 44 to form a contact 50. A tungsten-based or titanium-based liner may be applied to clad the sidewalls and bottom surface of the vias 42, 44 and/or the trench 24 prior to conductor deposition. A representative conductor for the contact plug 46 and contacts 48, 50 is a metal, such as tungsten (W), deposited by chemical vapor deposition.

A dielectric layer 52 of a wiring level 54 of the interconnect structure 32 is deposited and a wire 56 may be formed in the dielectric layer 52. The wire 56 is coupled with the contact plug 46 by the contact 48 and coupled with the device structure 14 by the contact 50 so that the device structure 14 is coupled by the wire 56 with the contact plug 46. The wire 56 in the wiring level 54 may be formed by deposition, polishing, lithography, and etching techniques characteristic of a damascene process. Candidate conductors for the wire 56 are metals such as copper (Cu) and aluminum (Al). These types of metals may be deposited by chemical vapor deposition or an electrochemical process like electroplating or electroless plating. The dielectric layer 52 may be comprised of any suitable organic or inorganic dielectric material, such as silicon dioxide, hydrogen-enriched silicon oxycarbide (SiCOH), fluorosilicate glass (FSG), or another type of low-k dielectric material that may be deposited by chemical vapor deposition, such as low-pressure chemical vapor phase deposition or plasma-enhanced chemical vapor deposition (PECVD).

The interconnect structure 32 is coupled with the integrated circuits of the chip and, as illustrated, is specifically coupled with the device structure 14. Other active and passive circuit elements, such as diodes, resistors, capacitors, varactors, and inductors, may be integrated into the interconnect structure 32 and available for use on the chip. The interconnect structure 32 may be comprised of a plurality of wiring levels that supply conductive paths for signals, clock, power, etc. In the representative embodiment, a passive device 58 is located in the wiring level 54. In an alternative embodiment, the passive device 58 may be coupled by the contact 48 and wire 56 by with the contact plug 46.

A temporary substrate 60 is removably attached to a top surface of the interconnect structure 32 at the frontside of the SOI substrate 10 while the handle wafer 20 is intact and after the contact plug 46 and the interconnect structure 32 are formed. For example, the temporary substrate 60 may be adhesively bonded by an adhesive layer to the top surface of interconnect structure 32 in order to provide the removability. The temporary substrate 60 is sufficiently thick for mechanical handling when the handle wafer 20 is removed in subsequent fabrication stage to thin the SOI substrate 10 at its backside. The temporary substrate 60 may be comprised of quartz or a glass, and the adhesive layer may be comprised of a polymer adhesive. The adhesive strength of the adhesive layer may be selected such that the temporary substrate 60 is readily removable from the top surface of the interconnect structure 32 in a subsequent debonding operation.

Figure 5:
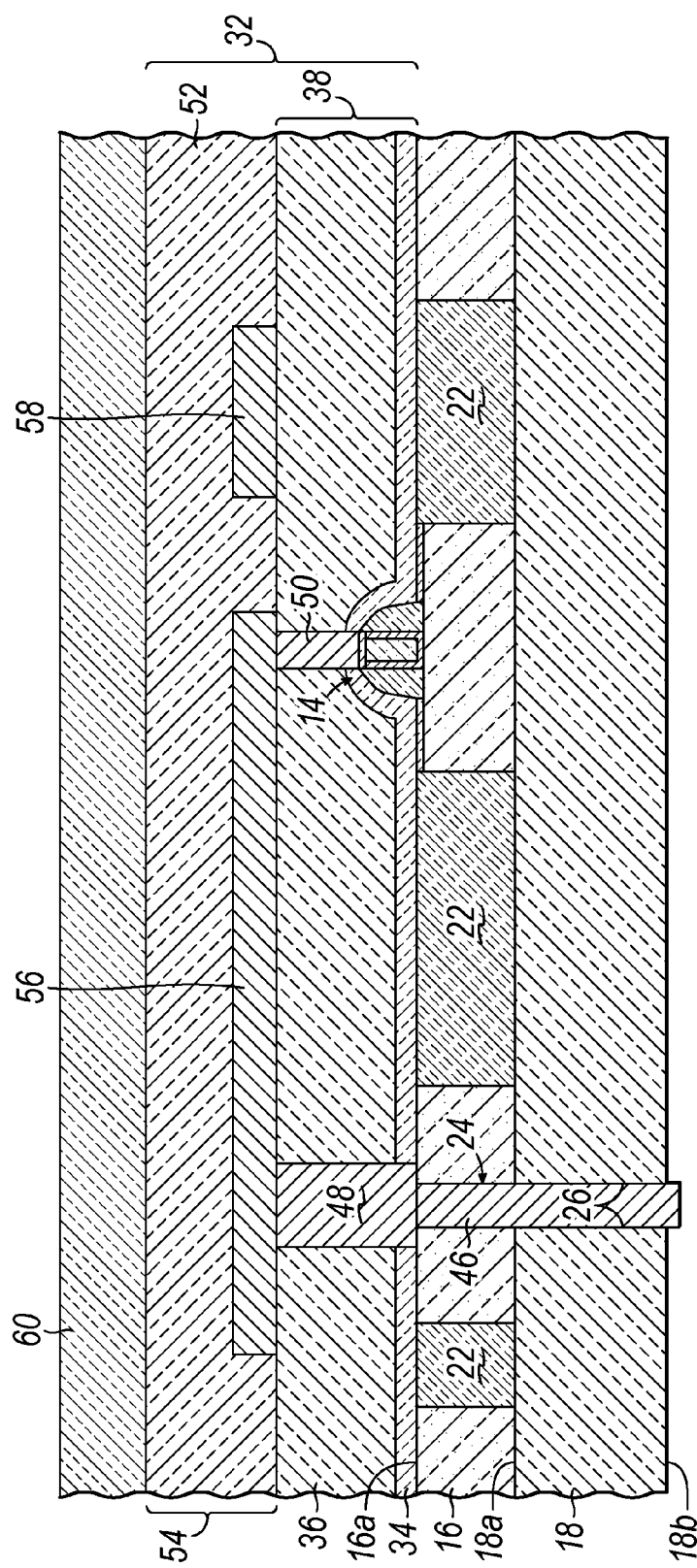

With reference to FIG. 5 in which like reference numerals refer to like features in FIG. 4 and at a subsequent fabrication stage of the processing method, after the temporary substrate 60 is attached, the handle wafer 20 may be removed in its entirety by grinding, etching, and/or polishing to expose the back surface 18b of the buried insulator layer 18. The removal of the handle wafer 20 may be performed selective to the removal of the buried insulator layer 18 so that the buried insulator layer 18 remains intact after the handle wafer 20 is removed.

After the handle wafer 20 is removed and with the temporary substrate 60 attached, the buried insulator layer 18 may be partially removed at its back surface 18b selective to the material (e.g., tungsten) of the contact plug 46 so that the buried insulator layer 18 is thinned before proceeding to the next fabrication stage. The partial removal of the buried insulator layer 18 may be accomplished by polishing and/or etching processes so that the contact plug 46 is revealed at the bottom surface 28 of the trench 24. In other words, the buried insulator layer 18 is thinned at least to reach the bottom surface 28 of the trench 24. After exposure, the tip of the contact plug 46 may project by a short distance beyond the back surface 18b of the buried insulator layer 18. In an alternative embodiment, the tip of the contact plug 46 may be coplanar with the back surface 18b. If the buried insulator layer 18 is comprised of silicon dioxide and the contact plug 46 is comprised of polysilicon, a hydrofluoric acid based etchant may be used to remove the material of the buried insulator layer 18 selective to (i.e., at a higher etch rate than) the material of the contact plug 46.

Figure 6:
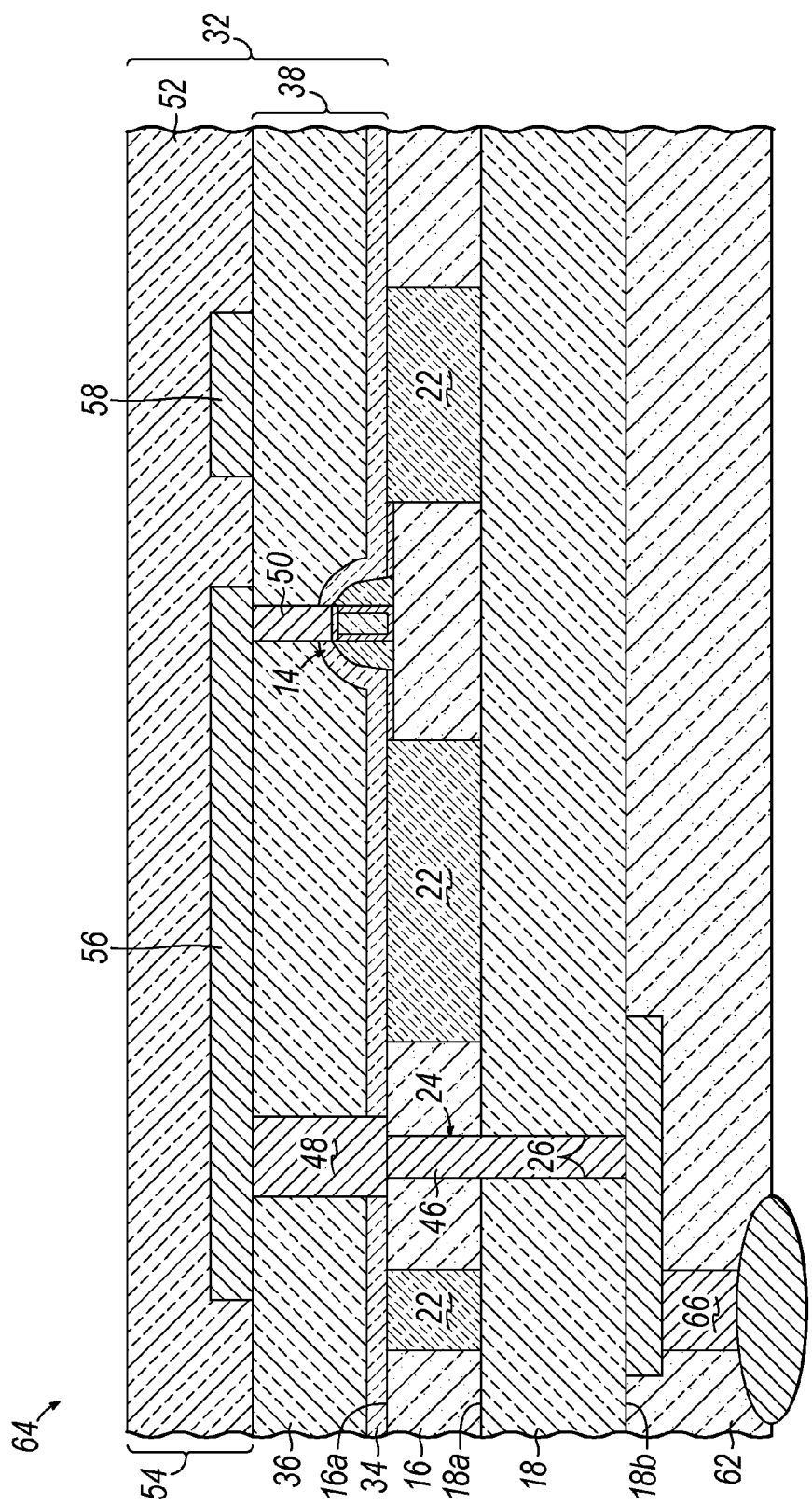

With reference to FIG. 6 in which like reference numerals refer to like features in FIG. 5 and at a subsequent fabrication stage of the processing method, a final substrate 62 is attached to the buried insulator layer 18 to form an intermediate assembly. To that end, the back surface 18b of the buried insulator layer 18 is placed in contact with a confronting surface of the final substrate 62, and these confronting surfaces are subsequently bonded together by, for example, a thermal process (e.g., oxide bonding). In alternative embodiments, one or more additional layers (e.g., a conductive adhesive layer and/or a trap-rich layer) may be disposed between the back surface 18b of the buried insulator layer 18 and the confronting surface of the final substrate 62. In this intermediate assembly, the device layer 16, the buried insulator layer 18, and the interconnect structure 32 are positioned between the temporary substrate 60 and the final substrate 62.

After the attachment to the final substrate 62 is made to form the intermediate assembly, the temporary substrate 60 is removed without disturbing the bond between the final substrate 62 and the buried insulator layer 18 to provide a final assembly 64 that includes the device layer 16 and the interconnect structure 32. The temporary substrate 60 functions to facilitate the transfer of the integrated circuits in and on the device layer 16 to the final substrate 62, which carries the device layer 16, the buried insulator layer 18, and the interconnect structure 32. The final substrate 62 in the final assembly 64 replaces the handle wafer 20 of the SOI substrate 10 in the initial assembly.

The final substrate 62 may be engineered to reduce harmonics, which may improve linearity in advanced generation switch technology by reducing harmonic distortion (e.g., the linearity observed at the output of coplanar waveguide (CPW) transmission lines) in comparison with the harmonic distortion that would may be expected to be observed with the handle wafer 20 intact and in place at the backside. For example, the second and third harmonics may be improved by more than 20 dB, which may permit devices to meet or surpass inter-modulation distortion switch specifications. In various embodiments, the final substrate 62 may be an engineered high-resistance wafer comprised of high resistance silicon, sapphire, quartz, alumina, etc. The handle wafer 20 is present only during processing to fabricate the integrated circuits of the chip and is then replaced by the final substrate 62 to provide the final assembly 64 that may be expected to exhibit improved performance metrics. Because it is replaced, the handle wafer 20 may be an inexpensive substrate (e.g., a common silicon wafer).

The electrical contact provided by the contact plug 46 is formed and terminated, when formed, within the buried insulator layer 18 of the SOI substrate 10 and not within the handle wafer 20. During the removal of the handle wafer 20, the contact plug 46 is not removed and is protected within the buried insulator layer 18. Subsequent to the removal of the handle wafer 20, the buried insulator layer 18 is thinned to reveal the contact plug 46 so that a conductive path 66 in the final substrate 62 can make electrical contact (i.e., an ohmic contact) with the contact plug 46 upon bonding of the final substrate 62 to the buried insulator layer 18. The conductive path 66 permits the contact plug 46 to be externally coupled with, for example, a signal source, which can then be used to provide signals for operating the device structure 14.

Figure 7:
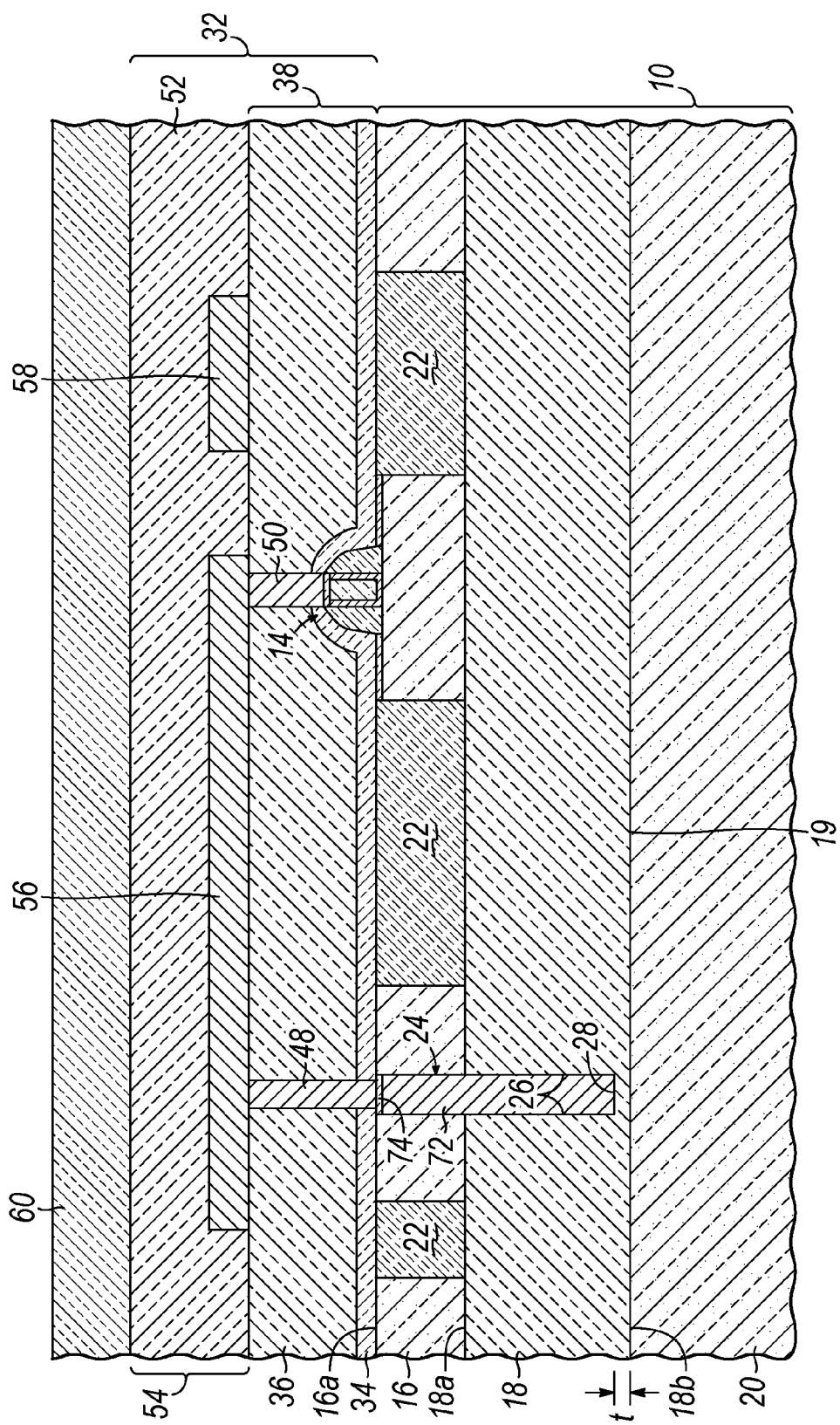
FIGS. 7-9 are cross-sectional views of a portion of a substrate at successive fabrication stages of a processing method for fabricating a backside device contact in accordance with an alternative embodiment of the invention.

With reference to FIG. 7 in which like reference numerals refer to like features in FIG. 4 and at a subsequent fabrication stage of a processing method in accordance with an alternative embodiment, an intermediate device structure is formed that is similar to the intermediate device structure at the fabrication state of FIG. 4. However, in connection with the fabrication stage of FIG. 1, a sacrificial plug 72 is formed in the trench 24 instead of the sacrificial plug 30. In a representative embodiment, the sacrificial plug 72 may be comprised of a sacrificial material such as polysilicon (i.e. polycrystalline silicon) deposited by chemical vapor deposition. In the representative embodiment, the sacrificial plug 72 extends through one of the shallow trench isolation regions 22. Alternatively, the sacrificial plug 72 may extend through the device layer 16. The fabrication stage of FIG. 2 is omitted such that the sacrificial plug 72 is not removed before the interconnect structure 31 is formed and the temporary substrate 60 is attached. However, the sacrificial plug 72 may be capped by a portion of a silicide layer 74, which also has a portion present on the gate electrode of the representative device structure 14. Through the use of the sacrificial plug 72, the formation of the contact plug in the trench 24 is delayed to a later fabrication stage.

Figure 8:
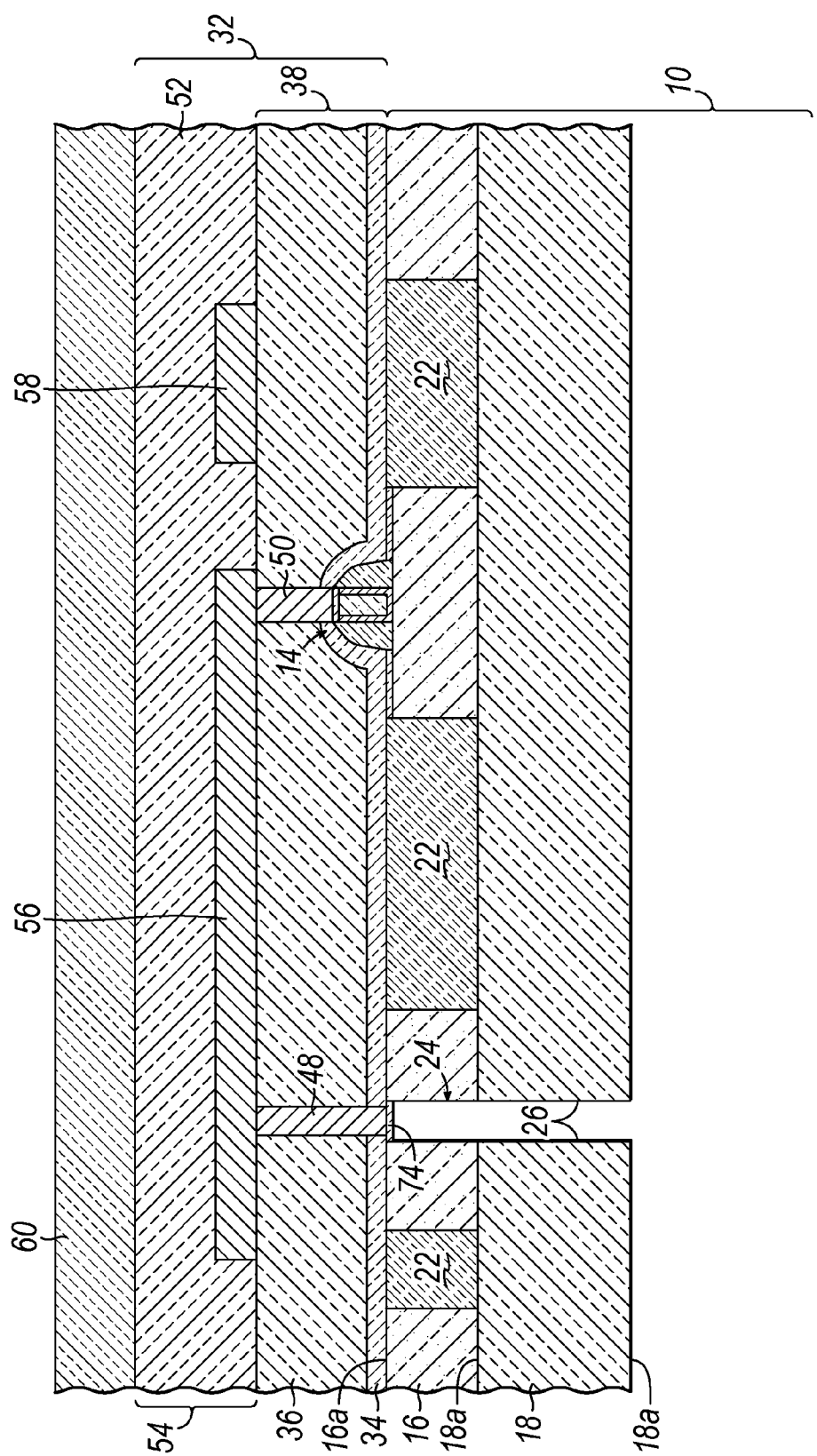

With reference to FIG. 8 in which like reference numerals refer to like features in FIG. 7 and at a subsequent fabrication stage of the processing method, the handle wafer 20 is removed in its entirety by grinding, etching, and/or polishing to expose the back surface 18b of the buried insulator layer 18. The removal of the handle wafer 20 may be performed selective to the removal of the buried insulator layer 18 so that the buried insulator layer 18 in intact after the handle wafer 20 is removed. After the handle wafer 20 is removed and with the temporary substrate 60 attached, the buried insulator layer 18 may be partially removed at its back surface 18b so that the buried insulator layer 18 is thinned before proceeding to the next fabrication stage. The partial removal of the buried insulator layer 18 may be accomplished by polishing and/or etching processes so that the sacrificial plug 72 is revealed at the bottom surface 28 of the trench 24. In other words, the buried insulator layer 18 is thinned, at a minimum, to reach the bottom surface 28 of the trench 24.

After the bottom surface 28 of the trench 24 and the sacrificial plug 72 are exposed, the sacrificial plug 72 is removed from the trench 24 by an etching process. In an embodiment, the sacrificial plug 72 may be removed by etching using an etching process that removes the material of the sacrificial plug 72 selective to (i.e., at a higher rate than) the material of the buried insulator layer 18. An exemplary etching process that may be used is a wet chemical etch using a chemistry of nitric acid ($HFNO_3$) and hydrofluoric acid (HF) that etches silicon selective to silicon dioxide. The etching process removing the sacrificial plug 72 may be associated with the removal of the handle wafer 20.

Figure 9:
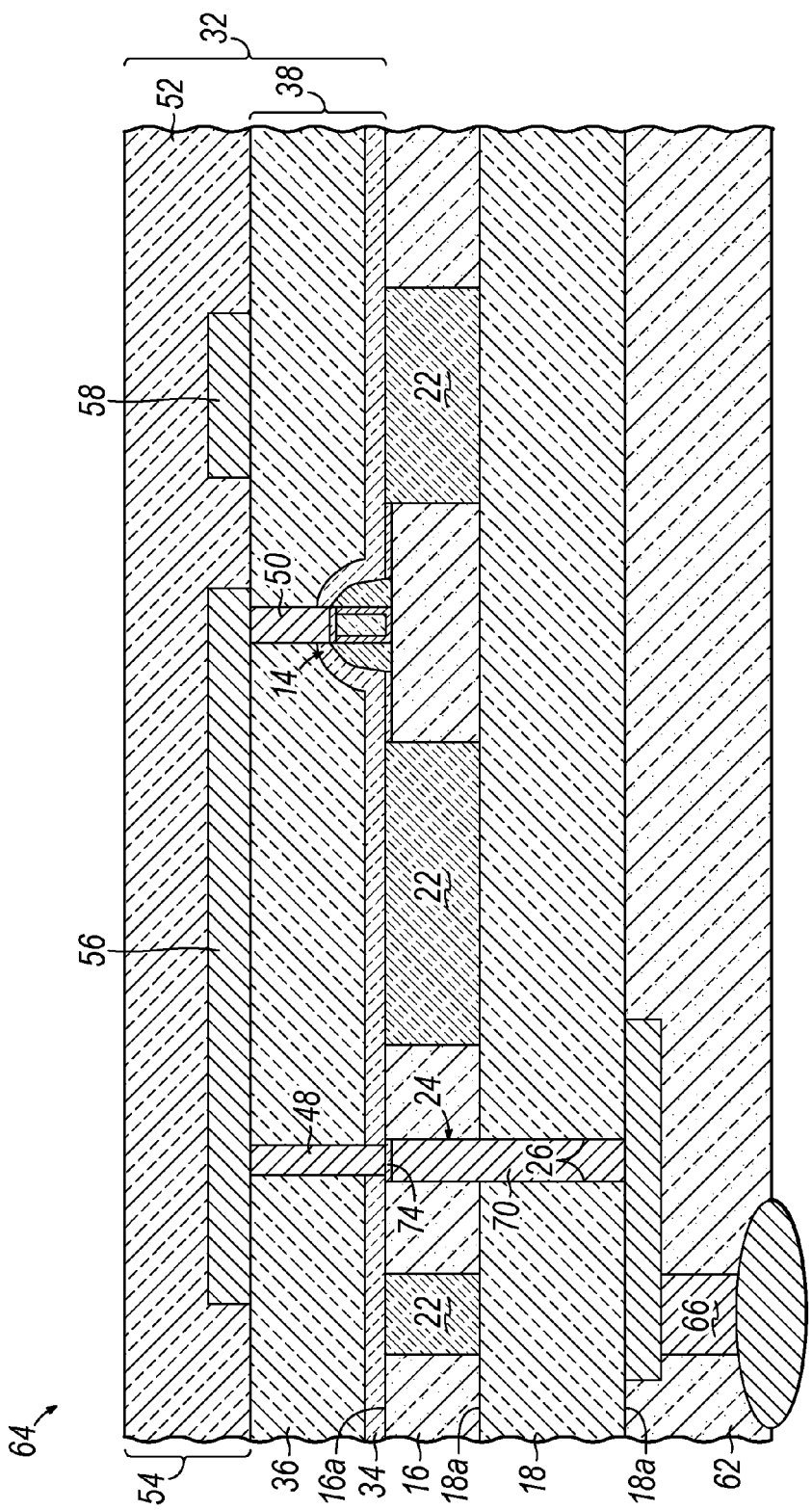

With reference to FIG. 9 in which like reference numerals refer to like features in FIG. 4 and at a subsequent fabrication stage of the processing method, the SOI substrate 10 may be safely handled and subjected to further processing of the back surface 18b of the buried insulator layer 18. Backside processing may include chemical mechanical polishing, etching, metal and dielectric deposition, patterning (e.g., photolithography and etching), cleaning, etc. During backside processing and after the sacrificial plug 72 is removed from the trench 24, the trench 24 is filled with a conductor to form a contact plug 70 that is similar in construction and function to contact plug 46. The wire 56 is coupled with the contact plug 70 by the contact 48 and coupled with the device structure 14 by the contact 50 so that the device structure 14 (or, alternatively, the passive device 58) is coupled by the wire 56 with the contact plug 70. After the backside processing is completed and the final substrate 62 is attached, the temporary substrate 60 is subsequently removed by debonding to create the final assembly 64.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a dimension within the horizontal plane.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a backside device contact using a silicon-on-insulator substrate that includes a device layer, a buried insulator layer, and a handle wafer, the method comprising:
   forming a trench that extends through the device layer or a trench isolation region in the device layer and that further extends partially through the buried insulator layer;
   depositing a sacrificial material in the trench;
   after the sacrificial material is deposited in the trench, forming at least one dielectric layer on the device layer:
   forming a first opening in the at least one dielectric layer that communicates with the trench;

removing the sacrificial material from the trench with access through the first opening;

after the sacrificial material is removed from the trench, filling the trench with a contact plug and the first opening with a first contact coupled with the contact plug, wherein the backside device contact includes the contact plug;

after the trench is filled with the contact plug, removing the handle wafer to reveal the buried insulator layer;

after the handle wafer is removed, partially removing the buried insulator layer to expose the trench containing the contact plug;

after the buried insulator layer is partially removed, coupling a final substrate to the buried insulator layer such that the contact plug contacts metallization of the final substrate; and forming a device structure using the device layer, wherein the contact plug is externally coupled with a source to provide signals to the device structure through a wire formed in the at least one dielectric layer.

2. The method of claim 1 wherein the buried insulator layer includes a first surface in direct contact with the device layer, a second surface in direct contact with the handle wafer, and the trench includes sidewalls extending from a top surface of the device layer through the device layer and a bottom surface terminating within the buried insulator layer between the first surface and the second surface.

3. The method of claim 2 wherein partially removing the buried insulator layer to expose the contact plug comprises:
removing a portion of the buried insulator layer to expose the bottom surface of the trench at the second surface of the buried insulator layer.

4. The method of claim 3 wherein coupling the final substrate to the buried insulator layer comprises:
after the bottom surface of the trench is exposed at the second surface of the buried insulator layer, attaching a surface of the final substrate to the second surface of the buried insulator layer to place the contact plug in contact with the metallization of the final substrate.

5. The method of claim 1 further comprising:
forming a second opening in the at least one dielectric layer that is aligned with the device structure.

6. The method of claim 5 further comprising:
filling the second opening with a second contact coupled with a portion of the device structure.

7. The method of claim 6, wherein
the wire is coupled with the first contact and with the second contact.

8. The method of claim 1 wherein the sacrificial material is comprised of germanium, and the first contact and the contact plug are comprised of tungsten.

9. The method of claim 1 wherein the trench extends through the trench isolation region in the device layer.

10. A method for fabricating a backside device contact using a silicon-on-insulator substrate that includes a device layer, a buried insulator layer, and a handle wafer, the method comprising:

forming a trench that extends through the device layer or a trench isolation region in the device layer and that further extends partially through the buried insulator layer;

depositing a sacrificial material in the trench;

after the sacrificial material is deposited in the trench, removing the handle wafer; after the handle wafer is removed, partially removing the buried insulator layer to expose the trench containing the sacrificial material;

after the trench is exposed, removing the sacrificial material from the trench;

after the sacrificial material is removed from the trench, forming a contact plug in the trench, wherein the backside device contact includes the contact plug;

coupling a final substrate to the contact plug such that the contact plug contacts metallization of the final substrate; and forming a device structure using the device layer, wherein the contact plug is externally coupled with a source to provide signals to the device structure through a wire formed in the at least one di electric layer.

11. The method of claim 10 wherein the buried insulator layer includes a first surface in direct contact with the device layer, a second surface in direct contact with the handle wafer, and the trench includes sidewalls extending from a top surface of the device layer through the device layer and a bottom surface terminating within the buried insulator layer between the first surface and the second surface.

12. The method of claim 11 wherein partially removing the buried insulator layer to expose the contact plug comprises:
removing a portion of the buried insulator layer to expose the bottom surface of the trench at the second surface of the buried insulator layer.

13. The method of claim 12 further comprising:
after the bottom surface of the trench is exposed at the second surface of the buried insulator layer, coupling a surface of the final substrate to the second surface of the buried insulator layer to place the contact plug in contact with the metallization of the final substrate.

14. The method of claim 10 further comprising:
forming a first contact in the at least one dielectric layer that is aligned with the trench,
wherein the first contact is coupled with the contact plug after the trench is filled with the contact plug.

15. The method of claim 14 further comprising:
forming a second contact in the at least one dielectric layer that is coupled with a portion of the device structure.

16. The method of claim 15, wherein
the wire is coupled with the first contact and with the second contact.

17. The method of claim 10 wherein the sacrificial material is comprised of polycrystalline silicon, and the contact plug is comprised of tungsten.

18. The method of claim 10 wherein the trench extends through the trench isolation region in the device layer.

* * * * *